United States Patent [19]

Katz

[11] 4,132,948
[45] Jan. 2, 1979

[54] TEST FIXTURE USING STOCK PRINTED CIRCUIT BOARD HAVING TEST PINS MOUNTED THEREON

[75] Inventor: Jonathon H. Katz, Brookline, Mass.

[73] Assignee: Teradyne, Inc., Boston, Mass.

[21] Appl. No.: 778,505

[22] Filed: Mar. 17, 1977

[51] Int. Cl.² ..................... G01R 31/02; G01R 15/12
[52] U.S. Cl. ........................... 324/158 F; 324/73 PC
[58] Field of Search .......... 324/158 F, 158 P, 73 AT, 324/51, 73 PC; 174/97, 117 R, 117 F, 117 FF

[56] References Cited

U.S. PATENT DOCUMENTS

| | | | |
|---|---|---|---|
| 2,918,648 | 12/1959 | Ludman et al. | 324/158 P |
| 3,082,292 | 3/1963 | Gore | 174/117 F |
| 3,584,300 | 6/1971 | Schulz | 324/158 F |
| 3,622,687 | 11/1971 | Doughty | 174/117 F |
| 3,941,966 | 3/1976 | Schatz | 174/117 F |
| 4,061,969 | 12/1977 | Dean | 324/73 PC |

OTHER PUBLICATIONS

German Printed Application, Fahrbach, F8143, Jan. 1952.

Primary Examiner—Rudolph V. Rolinec
Assistant Examiner—Ernest F. Karlsen

[57] ABSTRACT

An electrical tester for circuit boards in which test pins are mounted in a support derived from a corresponding unloaded circuit board and in which wires to the test pin run slidably in interfitting pairs of plastic sleeves.

10 Claims, 13 Drawing Figures

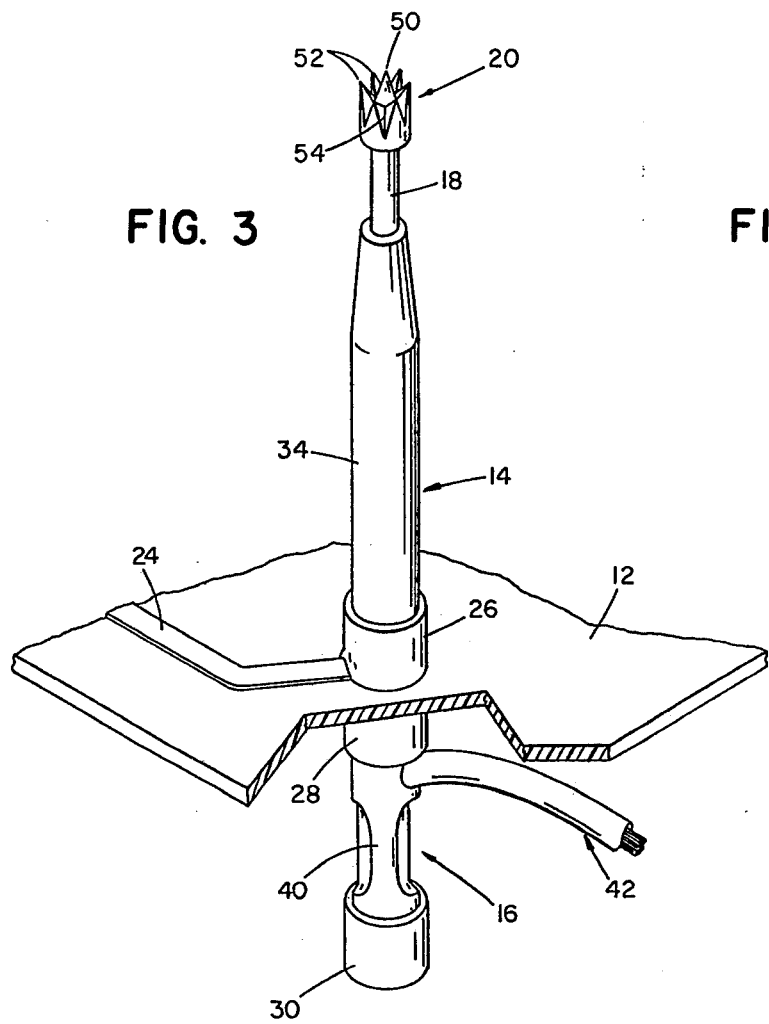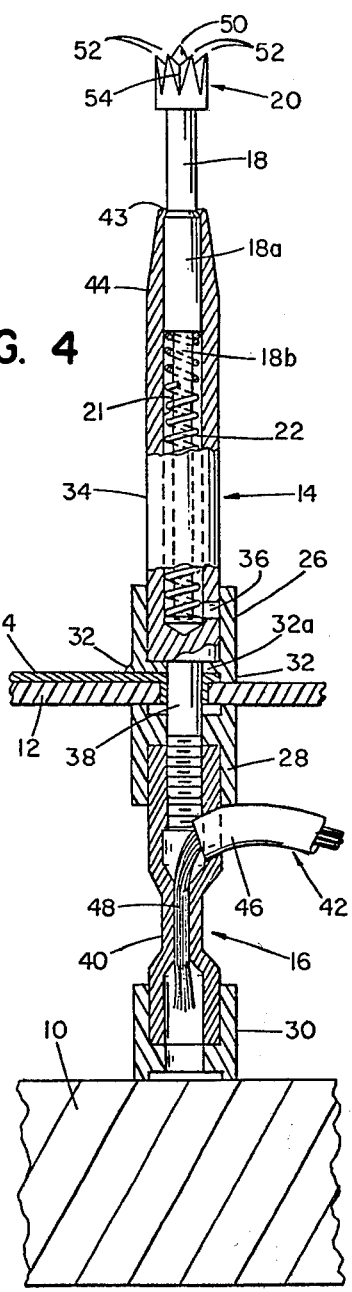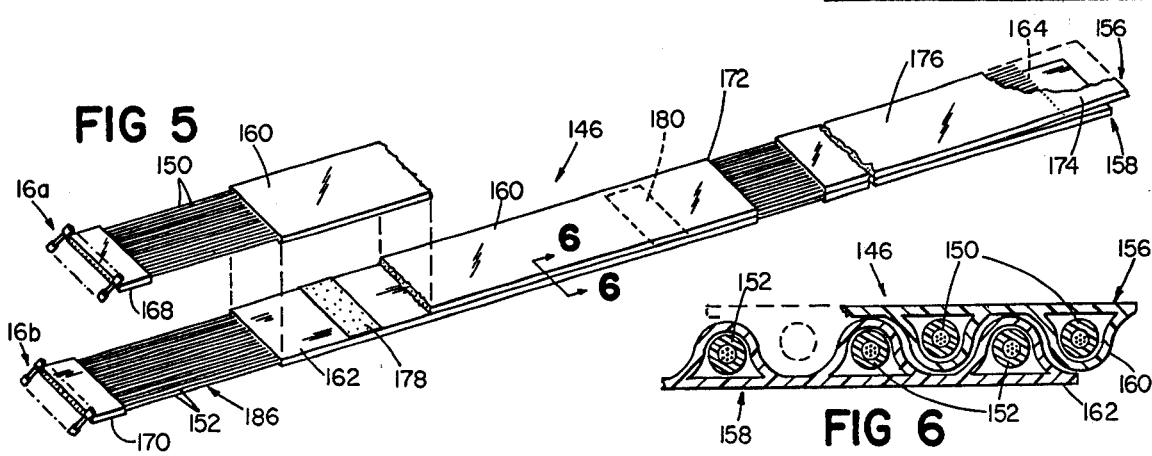

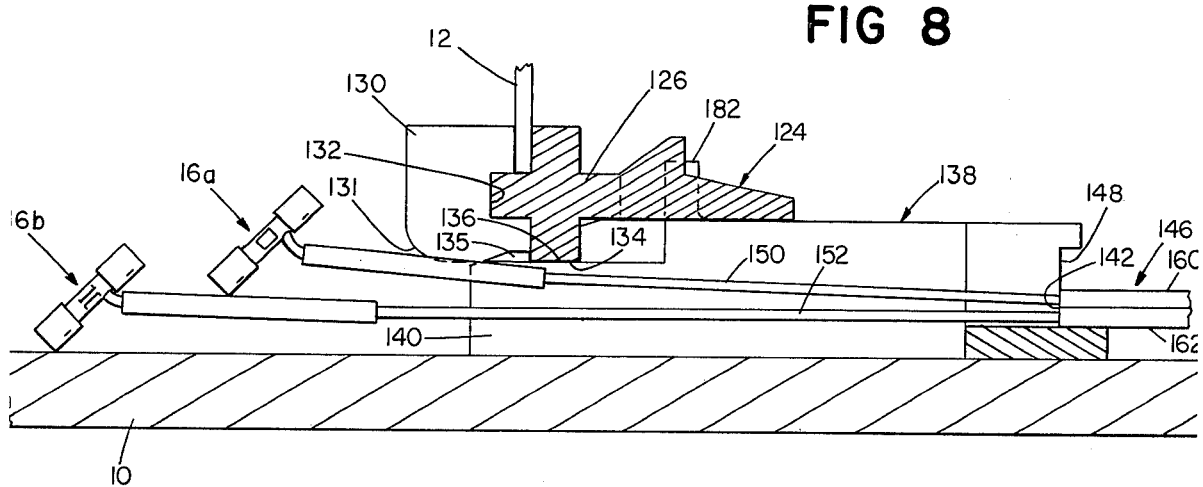
FIG 8
FIG 10
FIG 13
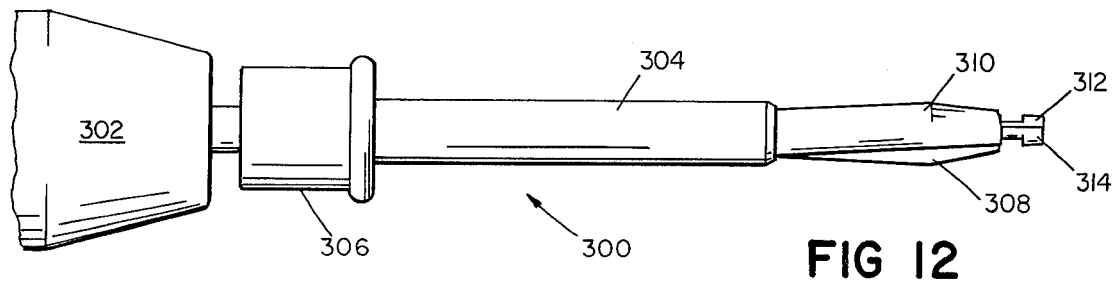
FIG 12

TEST FIXTURE USING STOCK PRINTED CIRCUIT BOARD HAVING TEST PINS MOUNTED THEREON

FIELD OF THE INVENTION

This invention relates to the electrical testing of circuit boards.

BACKGROUND OF THE INVENTION

Testing of printed circuit boards ("PCB's") loaded with the components they were designed to carry, in order to check electricl integrity, has traditionally involved cumbersome and unduly time-consuming fabrication of a fixture carrying test pins.

SUMMARY OF THE INVENTION

In one aspect of the invention, an unloaded PCB otherwise corresponding to the loaded PCB's to be tested is used as a critical element of the test fixture. In another aspect, novel cable assemblies featuring wires easily slidable in multiple-wire sheaths are provided. In another aspect, novel cable assemblies featuring two tiers of multiple-wire sheaths are provided. In yet another aspect novel crossbar assemblies for handling the unloaded and loaded PCB's are provided. In a further aspect, a special tool facilitating the mounting of test pins is provided.

Other novel features, elements, aspects, and advantages and combinations thereof will be set forth hereinafter.

PREFERRED EMBODIMENT

I turn now to description of a presently preferred embodiment of the invention.

Drawings

FIG. 3 is a perspective view of the preferred embodiment of test pin;

FIG. 4 is a vertical sectional view through said test pin;

FIG. 5 is a perspective view of the preferred embodiment, partially broken away, of the preferred cable assembly of the invention;

FIG. 6 is a partial sectional view at 6—6 of FIG. 5;

FIG. 8 is a partial sectional view at 8—8 of FIG. 1;

FIG. 10 is a perspective view of a preferred embodiment of tool of the invention;

FIG. 12 is a side view of a tool helpful in positioning and tightening the test pins; and FIG. 13 is an end view of said tool.

DESCRIPTION

Figure 1:
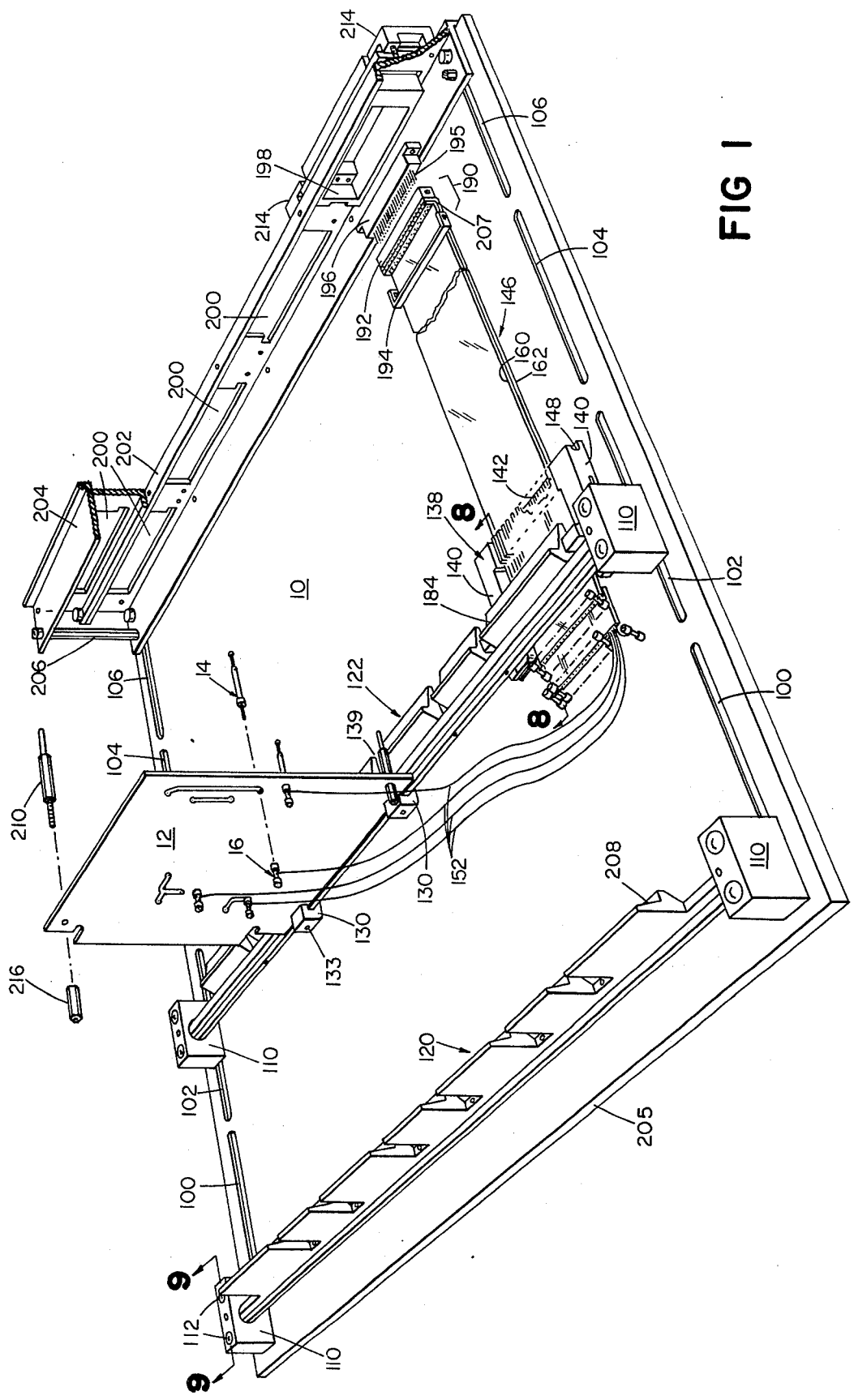
FIG. 1 is a perspective view, partially in section and partially exploded, of the presently preferred embodiment of the invention, at the stage of mounting test pins on an unloaded PCB.

The embodiment shown in the drawings and its operation are now described.

1. Embodiment

Figure 9:
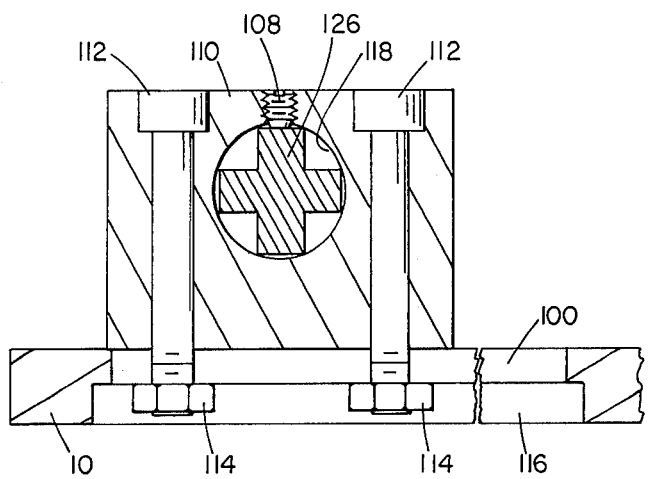
FIG. 9 is a partial sectional view at 9—9 of FIG. 1.
Figure 2:
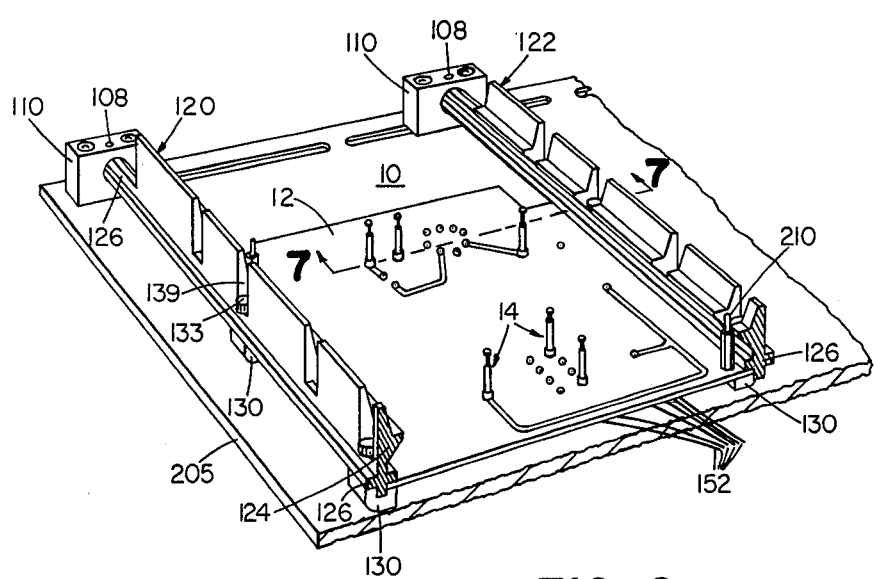
FIG. 2 is a broken-away view of a portion of the embodiment of FIG. 1, diagrammatic in that only a portion of a complete array of test pins is shown in position.

The ¼ inch thick phenolic baseplate 10 carries along each of opposed edges slots 100, 102, 104, and 106. Each slot is adapted to accept a hinge block 110, which can be held therein (FIG. 9) by means of socket head bolts 112, nuts 114 of which may be moved along widened (but not enough to permit said nuts to turn) portions 116 of slots 100, 102, 104, and 106 when said bolts are loosened. As shown, hinge blocks are mounted in each slot of the pairs of slots 100 and 102. Rotatably mounted in blind holes 118 of each pair of hinge blocks is a crossbar; parallel and facing crossbars 120 and 122 are shown, and are formed from aluminum extruded with a cross-section as at 124 (FIG. 2), and coated with Teflon (Du-Pont trademark) to counter short circuits. Only the cruciform portion 126 is retained at the ends of the crossbars, and (as best seen in FIG. 9) the eight outer edges of said portion are journaled at each end in a blind hole 118, to provide crossbar bearings. Crossbars 120 and 122 may be selectively locked against rotation using set screws 108 (FIG. 9).

In assembling a test fixture, an unloaded PCB 12 corresponding except in hole size to the component support of a loaded PCB 119 (FIG. 17) to be tested, provides a test pin support and is held against a lower surface 128 of a transversely intermediate portion of the cross portion 126 of each crossbar by a pair of Teflon-coated aluminum jaws 130, each of which includes a cooperating groove 132 and a rounded portion 131 (to permit crossbar rotation); a bolt 133 extending through cross portion 126 draws each jaw 130 into position. Its Allen head is accessible at crossbar notch 139.

In FIG. 8, the unloaded board 12 is shown moved into the position, for mounting test pins, shown in FIG. 1. In the preferred embodiment, holes in which test pins are to be mounted are further drilled out to larger diameters on the same centers. The lower surfaces or portions 134 of the cruciform cross-sectional portion 126 are engaged by transverse grooves 136 of plastic wiring tool 138 (FIG. 10), legs 140 of which include said grooves 136. A spring action owing to slots 137 permits depression and snapping back of projections 135 as the tool is inserted. (The crossbar may be rotated to remove the tool.) The end 142 of Mylar insulation 160, 162 of cable assembly 146 abuts against surface 148 of the tool 138, and wires 150 and 152 extend through grooves 154 in the tool 138 (FIG. 1).

The cable assembly 146 (FIGS. 5 and 6) includes a pair of interfitting cable subassemblies 156 and 158, comprising respectively Mylar (DuPont trademark) longitudinal sleeves 160 and 162, each enclosing, slidably mounted side-by-side in separated conduits therein, twenty insulated 24 gauge wires 150 and 152 on 0.100 inch centers. Slidability is aided by provision between wires and sleeves of silicone lubricant. The insulated wires 150 are colored black and the insulated wires 152 are colored blue; except that every fifth wire in each layer had its insulation colored white; all for aid in location and identification. Short Mylar sleeves 168 and 170 are provided adjacent rows of pins bases 16a and 16b, for initially holding the latter in staggered regimented lines. The Mylar sleeves are cut at 172 before shipment and use in the invention, and slid back to extend longitudinally beyond the end 164 of the wires, in the portion 174, to provide a handle to remove the entire portion 176 as actual use begins, both to diminish wire friction in pulling individual wires from the sleeves and to permit pulling back to some extent, at the end of rigging up the fixture, wires that have been pulled too far in rigging up the test fixture. The two sleeves 160 and 162 are held together by one-inch wide sticky (on both faces) tape at 178 and 180 so that all forty wires are now on 0.050 inch centers.

The elevated portions 182 of tool 138 fit on both sides of a wide lobe 184 (aligned with rear connector openings) of crossbar 122 (so that wires will be perpendicular to connectors when terminated). Prior to snapping tool groove 136 in position, the wires 150 and 152, at the cable assembly portion 186, are seated in grooves 156 of the tool. Snapping the tool into position fixes the Mylar jackets 160 and 162 against movement when wires 150 and 152 are drawn through them.

Figure 11:
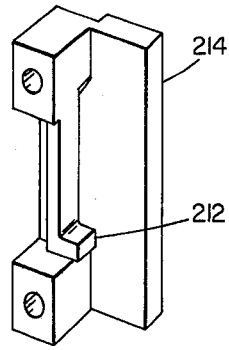
FIG. 11 is a perspective view of a spring finger unit of the preferred embodiment of the invention.

The termination of cable assembly 146 in Ansley connector 190 is shown in exploded view in FIG. 1. Element 192 is a standard Ansley item. Element 194 is modified to deal with the added thickness of my cable assembly. When elements 192 and 194 are snapped together through cable assembly 146, forty contacts to 24 gauge wire are consummated. Elements 192 are plugged onto posts 195 (0.025 inch, on 0.100 inch centers, sold by AMP) of receptacle modules 196 which are rigidly mounted into glass filled plastic receptacle housing 198 mounted in generally rectangular openings 200 of connector mounting panel 202, which may be provided with a second tier, as indicated at 204, in which case a brace bar 206 is provided for stability. (Cable assembly 146 is of course cut to length before termination with the Ansley connector and bending then to the shape shown at 207.) Receptacle 198 is held firmly longitudinally thereof, but with allowance for longitudinal movement either way of 0.050 inch, by spring fingers 212 (FIG. 11), each integrally formed of stiffly flexible molded nylon plastic with base 214, the latter being mounted on the back of mounting panel 202.

2. Operation

In operation, crossbar 120 is located at the front ends of slots 110 and crossbar 122 is located as dictated by the size of PCB to be tested; slots 106 would be used, for example, with large enough PCB's. A first crossbar 120 near the front of the fixture has its guide surface 208 facing the rear of the baseplate. A second crossbar 122 is then installed, using the slots chosen (here, slots 102), with its guide surfaces 208 facing upwardly, but pivotable to face frontwardly. An unloaded PCB board of the character described is then mounted on the crossbar 122, using jaws 130, and positioned as shown in FIG. 1. Tool 138 is then used in the manner described to position a cable assembly 146 in alignment with connector 190 as it will be mounted in due course, and with forty ends and forty test pin bases positioned as shown in FIG. 5. Each wire 150 or 152 is then (after pulling off portion 176) pulled partially out through its sleeve 160 or 162 to assemble a test pin base 16 with a test pin portion 14 on an unloaded test pin support 12 corresponding to the body of a loaded PCB 119 to be tested in the manner described in my recently filed and only currently copending patent application, entitled "Test Pin" and filed Dec. 27, 1976, Ser. No. 757,778 (hereby incorporated by reference herein), to provide a test pin for each location to be tested in loaded PCB's. Each test pin is mounted intermediate its ends, and with a crown 20 yieldably limitedly upwardly spring-biased. Lower portions of the test pin are supported by the base 10, and in turn support test pin support 12.

It is helpful in enlarging holes and later in assembling the test pins to the unloaded board to circle each hole in which a pin is to be placed. If every fifth such hole is circled in a different color, correlation of such holes with the white wires will provide automatic running confirmation that no mistake is being made. It is preferable to terminate all forty wires and pin bases of any particular cable assembly in close proximity as a "family".

After each family of pins has been mounted, all wires from its pins are held firmly against the bottom of the unloaded board using a length of waxed thread run among the pin bases, and frequently being wrapped around individual bases. As each family is wired, its group of wires is pulled at their ends (near 164) of the cable assembly to remove slack and the group is tied together with the same waxed string (not shown). After all families have been thus installed, the unloaded but testing-equipped PCB 12 can then be lowered (without wires falling below the pin bases) from the position of FIG. 1 to the position of FIG. 2, and locked to crossbar 120 with further jaws 130. Bowing of the unloaded board 12 can be minimized substantially by holding the crossbars 120, 122 in their correct vertical position and tightening set screws 108. Once the PCB 12 is in its final horizontal seated position, the cable assembly is then cut, and the Ansley connector 190 applied, bent, and plugged in. Each connector can accommodate forty wires, and three connectors can be plugged into each receptacle 198. One horizontal row of four connectors is mounted before beginning any second horizontal row.

Figure 7:
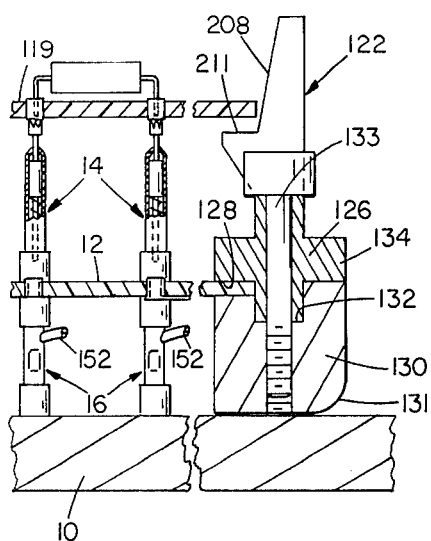
FIG. 7 is a partial sectional view at 7—7 of FIG. 2 but with the addition of a portion of a board being tested.

A loaded PCB board to be tested, indicated generally at 119 (FIG. 7), is guided (guide pins 210 mounted in diagonally opposed routing holes in the unloaded PCB's mate with correspondingly situated routing holes in the loaded PCB's to provide for their precise proper positioning with respect to each other; the guide pins 210 secured in elements 216, also help support board 12 on the surface of baseplate 10) by facing angled guide surfaces 208 of crossbars 122 and 120 (crossbar 120 is not shown in FIG. 7) past the position shown in FIG. 7 onto coplanar stop surfaces 211. Surfaces 208, in aiding in seeking guide pins 210, aid in avoiding accidental damage to test pins as portions of the loaded board to be tested are urged downwardly thereagainst. If a pin is damaged, only the top portion 14 need be replaced, which is a recognized advantage. Forces imposed on the test pins by board 119 are transmitted longitudinally through the pins and ultimately carried by baseplate 19.

The tool indicated generally at 300 (FIGS. 12 and 13) is useful in both positioning and tightening the test pins. Handle 302 carries shaft 314 on which is longitudinally slidably mounted sleeve 304 with integral flange 306 for aid in pushing. Shaft 304 is bifurcated toward its end to provide portions 308 and 310 which are springingly biased transversely away from each other, and which have outer tips 312 and 314. When the sleeve is moved toward the handle after inserting the brought-together tips 312 and 314 in the bottom of a pin portion 16, the tips move apart to provide a firm grip on the pin portion 16, so that it may be positioned on the pin support, and tightened without slipping.

Because PCB 12 is an unloaded twin of loaded PCB 119, orientation of test pins to portions desired to be tested is greatly facilitated.

The technique disclosed for making connections, a key feature of which is slidability of wires in positioned plastic sleeves, has great advantages of labor savings, avoiding need to cut wires to length and halving the solder joints needed, and is much more generally applicable.

Although of primary value for testing loaded PCB's, the invention is also useful for testing other circuit boards, whether or not loaded.

Conclusion

Other embodiments are within the scope of the invention and claims.

What is claimed is:

1. A test fixture for testing the electrical integrity of a first board of insulating material having a particular hole pattern and bearing printed circuit conductors and electrical components forming a loaded printed circuit board comprising:

a second board of insulating material identical to the first board of insulating material, said second board of insulating material bearing holes having an identical hole pattern to that of the first board of insulating material, said second board bearing printed circuit conductors of a configuration identical to that of the first board of insulating material, test pins being mounted in said holes of said second board of insulating material to thereby correspond spacially with test points on the loaded printed circuit board, the second board being derived from stock having holes and printed circuit conductors for producing the loaded printed circuit board.

2. The test fixture of claim 1 in which said test pins are mounted intermediate the length of said test pins, wherein said test pins have crowns spring-biased in an upward direction, and wherein said test pin include means to limit the upward travel of the crowns.

3. A test fixture for testing the electrical integrity of a first board of insulating material having a particular hole pattern and bearing printed circuit conductors and electrical components forming a loaded printed circuit board comprising:

a second board of insulating material identical to the first board of insulating material and bearing an identical hole pattern to that of the first board of insulating material, test pins being mounted in said second board of insulating material to thereby correspond spacially with test points on the loaded printed circuit board said test fixture further including:
base,
a pair of parallel crossbars mounted above said base for selective rotation relative thereto
said crossbars including, when rotated to facing testing position, facing angled guide surfaces and coplanar horizontal stop surfaces,
lower portions of said test pins being supported by said base, and
said second board of insulating material being given support by said lower portions of said test pins.

4. The test fixture of claim 3 in which ends of said crossbars are journaled in hinge blocks slidably mounted in said base to permit varying the distance between said crossbars.

5. The test fixture of claim 3 in which in said testing position said crossbars have lower extremities that are cruciform in cross-section and cooperate with jaws to secure said second board of insulating material therebetween.

6. The test fixture of claim 5 in which at the ends of said crossbars said cruciform in cross-section portions are the entire cross-sections of said crossbars, and are journaled in blind holes in hinge blocks slidably mounted in said base to permit varying the distance between said crossbars.

7. The test fixture of claim 6 in which said crossbars are formed from lengths of the same extruded cross-section.

8. The test fixture of claim 5 in which said jaws cooperate with said lower extremities to support the same on said base, and have a corner rounded to permit said selective rotation.

9. The test fixture of claim 2, in which lower portions of said test pins, on the other side of said test pin support from said crowns, are connected to a cable assembly.

10. The test fixture of claim 5 wherein portions of one of said crossbars away from said lower extremities are removed to provide at least one lobe, said further including a wiring-up tool element, said tool element including elevated portions engaging said lobe on each side thereof for transverse positioning of said tool element, a transverse groove snappably engageable with said lower extremities for longitudinal positioning, a multiplicity of wire-accepting grooves extending toward said crossbar when said wiring-up tool element is in working position, and a surface away from said crossbar when said wiring-up tool element is in working position to cooperate with an extremity of a cable assembly sleeve carrying wires longitudinally movable therein and extending therefrom to secure said sleeve against movement on pulling a wire carried therein.

* * * * *